US006214652B1

United States Patent
Batra et al.

(10) Patent No.: US 6,214,652 B1
(45) Date of Patent: *Apr. 10, 2001

(54) THIN FILM TRANSISTORS AND METHOD OF FORMING THIN FILM TRANSISTORS

(75) Inventors: Shubneesh Batra, Boise; Monte Manning, Kuna, both of ID (US); Sanjay Banerjee; John Damiano, Jr., both of Austin, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/442,340

(22) Filed: Nov. 17, 1999

Related U.S. Application Data

(63) Continuation of application No. 09/124,939, filed on Jul. 29, 1998, now Pat. No. 6,017,782, which is a continuation of application No. 08/674,194, filed on Jul. 1, 1996, now Pat. No. 5,904,513, which is a continuation of application No. 08/328,096, filed on Oct. 24, 1994, now abandoned.

(51) Int. Cl.[7] ................................................. H01L 21/84
(52) U.S. Cl. .......................... 438/149; 438/142; 438/149; 438/162; 438/163; 438/164; 438/166; 257/66
(58) Field of Search ..................... 438/149, 142, 438/162–66; 257/66

(56) References Cited

U.S. PATENT DOCUMENTS

| 4,385,937 | 5/1983 | Ohmura . |
| 4,420,870 | 12/1983 | Kimura . |
| 4,498,224 | 2/1985 | Maeguchi . |
| 4,528,480 | 7/1985 | Unagami et al. . |
| 5,112,764 | 5/1992 | Mitra et al. . |
| 5,198,379 | 3/1993 | Adan . |
| 5,208,476 | 5/1993 | Inoue . |
| 5,266,507 | 11/1993 | Wu . |
| 5,286,663 | 2/1994 | Manning . |
| 5,292,675 | 3/1994 | Codama . |
| 5,308,998 | 5/1994 | Yamazaki et al. . |
| 5,323,042 | 6/1994 | Matsumoto . |
| 5,344,790 | 9/1994 | Bryant et al. . |
| 5,412,493 | 5/1995 | Kunii et al. . |
| 5,420,055 | 5/1995 | Vu et al. . |
| 5,457,058 | 10/1995 | Yonehara . |
| 5,904,513 | * 5/1999 | Batra et al. ........................... 438/162 |

FOREIGN PATENT DOCUMENTS

| 62-76772 | 4/1987 | (JP) . |
| 1-11369 | 1/1989 | (JP) . |
| 64-11369 | 1/1989 | (JP) . |

(List continued on next page.)

OTHER PUBLICATIONS

Jung et al., "A Leakage Current Model for Sub–Micron Drain–Offset Polysilicon TFT's", Oct. 9, 1994, 4 pages.

(List continued on next page.)

*Primary Examiner*—Matthew Smith
*Assistant Examiner*—G. Lee
(74) *Attorney, Agent, or Firm*—Wells, St. John, Roberts, Gregory & Matkin, P.S.

(57) ABSTRACT

A thin film transistor includes: a) a thin film transistor layer comprising a source region, a channel region and a drain region; the thin film transistor layer further comprising a drain offset region positioned between the drain region and the channel region; b) the channel region being substantially polycrystalline and having a first average crystalline grain size; and c) the drain offset region being substantially polycrystalline and having a second average crystalline grain size, the second average crystalline grain size being larger than the first average crystalline grain size. A method for forming such a construction using polycrystalline materials, preferably polysilicon, and an amorphizing silicon implant with subsequent recrystallization is also disclosed.

5 Claims, 5 Drawing Sheets

FOREIGN PATENT DOCUMENTS

| | | |
|---|---|---|
| 1-158775 | 6/1989 | (JP) . |
| 1-251668 | 6/1989 | (JP) . |
| 1-50569 | 10/1989 | (JP) . |
| 3-104210 | 5/1991 | (JP) . |
| 4-152639 | 5/1992 | (JP) . |
| 4-162432 | 6/1992 | (JP) . |
| 4-306843 | 10/1992 | (JP) . |
| 58-56467 | 4/1993 | (JP) . |
| 5-152329 | 6/1993 | (JP) . |
| 6-112223 | 4/1994 | (JP) . |
| 6-163580 | 6/1994 | (JP) . |
| 6-232160 | 8/1994 | (JP) . |

OTHER PUBLICATIONS

Colinge et al., "Field Effect in Large Grain Polycrystalline Silicon", IEEE Transactions on Electron Devices, vol. ED–30, No. 3, Mar. 1983, pp. 197–201.

Hasimoto et al., Thin Film Effects of Double–Gate Polysilicon MOSFET, Ext. Abstracts of the 22nd Conf. of S.S. Devices and Materials, 1990, pp. 393–396.

Batra et al., "Development of Polysilicon TFT's for 16 Mb SRAMs and Beyond", SB Sep. 28, 1994, Jun. 21, 1993.

Batra, Shubneesh, "Development of Drain–Offset (DO) TFT Technology for High Density SRAMs", Oct. 9, 1994.

Webster's Ninth New College Dictionary, 1990, p. 1198.

Wolf, S., "Silicon Processing For The VLSI Era", vol. II, pp. 354–361 and 436–439.

Hayden et al., A High–Performance Quadruple Well, Quadruple Poly BiCMOS Process For Fast 16Mb SRAMs, IEEE, IEDM 92/819, pp. 819–822, 1992.

Tanaka et al., "Field–Induction Drain (FID) Poly–Si TFTs With High On/Off Current Ratio", Extended Abstracts of the 22nd Conf. on S.S. Devices and Materials, 1990, pp. 1011, 1014.

Hashimoto et al., "Thin Film Effects of Double–Gate Polysilicon MOSFET", Ext. Abstracts of the 22nd Conf. of S.S. Devices and Materials, 1990, pp. 393–396.

Batra et al., "Development of Polysilicon TFT's for 16Mb SRAMs and Beyond", Sep. 28, 1994, 2 pages.

Batra, Shubneesh, Development of Drain–Offset (DO) TFT Technology for High Density SRAMs, Oct. 9, 1994, 2 pages.

* cited by examiner

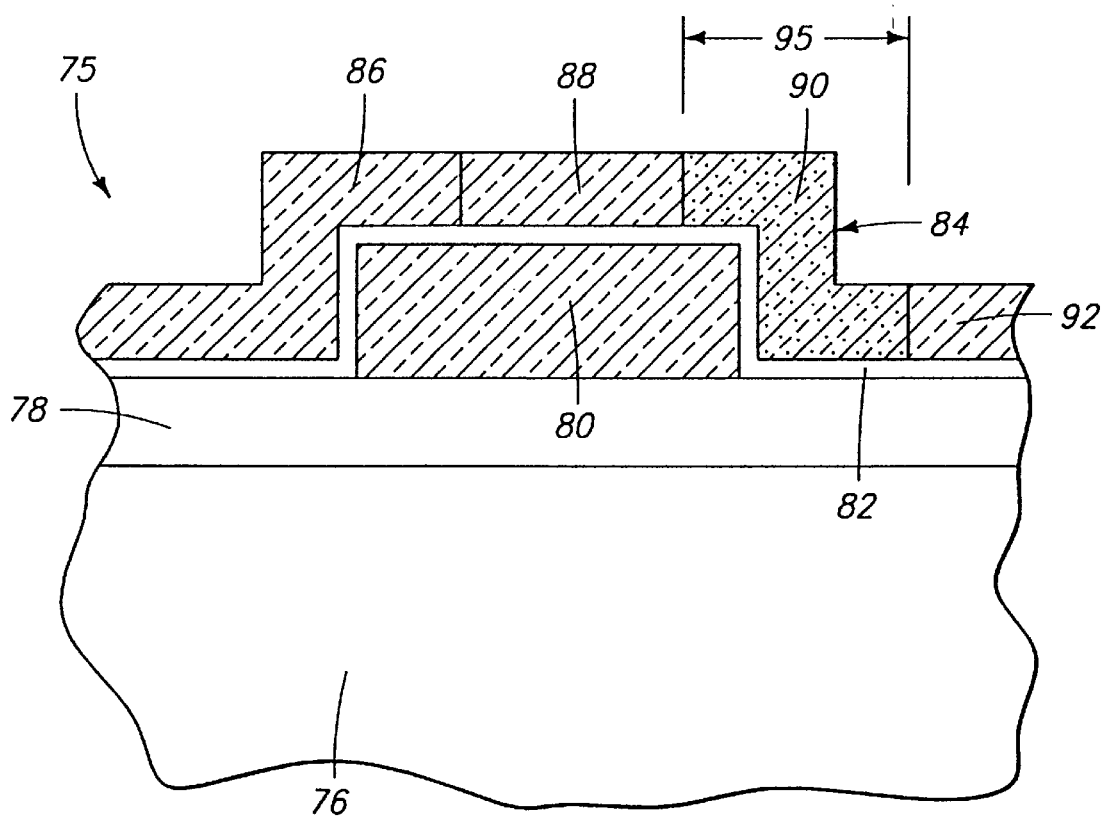

THIN FILM TRANSISTORS AND METHOD OF FORMING THIN FILM TRANSISTORS

RELATED PATENT DATA

This patent resulted from a continuation application of U.S. patent application Ser. No. 09/124,939, which was filed on Jul. 29, 1998 and now U.S. Pat. No. 6,017,782, which was a continuation application of U.S. patent application Ser. No. 08/674,194, filed on Jul. 1, 1996 and now U.S. Pat. No. 5,904,513, which is a file wrapper continuation application of prior U.S. application Ser. No. 08/328,096, filed on Oct. 24, 1994 abandoned.

TECHNICAL FIELD

This invention relates to thin film transistors and to methods of forming thin film transistors.

BACKGROUND OF THE INVENTION

As circuit density continues to increase, there is a corresponding drive to produce smaller and smaller field effect transistors. Field effect transistors have typically been formed by providing active areas within a bulk substrate material or within a complementary conductivity le type well formed within a bulk substrate. Although the field effect transistor feature size is reducing with advances in process technology, even smaller transistors can be formed from thin films deposited over oxide. These transistors are commonly referred to as "thin film transistors" (TF1).

With TFTs, a thin film of semiconductive material is first provided. A central channel region of the thin film is masked, while opposing adjacent source/drain regions are doped with an appropriate p or n type conductivity enhancing impurity: A gate insulator and gate are provided either above or below the thin film channel region, thus providing a field effect transistor having an active channel region formed entirely within a thin film as opposed to a bulk substrate.

The invention grew out of needs associated with TFTs and their usage in high-density static random access memories (SRAMs). A static memory cell is characterized by operation in one of two mutually exclusive and cell-maintaining operating states. Each operating state defines one of the two possible binary bit values, 0 or 1. A static memory cell typically has an output which reflects the operating state of the memory cell. Such an output produces a "high" voltage to indicate a "set" operating state. The memory cell output produces a "low" voltage to indicate a "reset" memory cell operating state. A low or reset output voltage usually represents a binary value of 0, and a high or set output voltage represents a binary value of 1.

A static memory cell is said to be bi-stable because it has two stable or self-maintaining operating states, corresponding to two different output voltages. Without external stimuli, a static memory cell will operate continuously in a single one of its two operating states. It has internal feedback to maintain a stable output voltage, corresponding to operating states of the memory cell, as long as the memory cell receives power.

The operation of the static memory cell is in contrast to other types of memory cells, such as dynamic cells, which do not have stable operating states. A dynamic memory cell-can be programmed to store a voltage which represents one of two binary values, but requires periodic reprogramming or "refreshing" to maintain this voltage for more than very short time periods. A dynamic memory cell has no feedback to maintain a stable output voltage. Without refreshing, the output of a dynamic memory cell will drift towards intermediate or indeterminate voltages, effectively resulting in loss of data.

Dynamic memory cells are used in spite of this limitation because of the significantly greater packaging densities which can be attained. For instance, a dynamic memory cell can be fabricated with a single MOSFET transistor, rather than the six transistors typically required in a static memory cell. SRAM cell density is maximized with three-dimensional integration. For example, load transistors of the SRAM cell constitute TFTs which are folded over the bulk transistors. Because of the significantly different architectural arrangements and functional requirements of static and dynamic memory cells and circuits, static memory design has developed along a different path than has the design of dynamic memories.

Ongoing efforts in SRAM circuitry have brought about the development of TFTs in an attempt to minimize space and for other advantageous regions associated with TFTs. While the invention grew out of needs associated with TFTs of SRAM circuitry, the artisan will appreciate applicability of the invention to other types of circuitry.

One common material utilized as the thin source, channel and drain film in a TFT is polysilicon. Such is comprised of multiple forms of individual single crystal silicon grains. The locations where two individual crystalline grains abut one another is commonly referred to as a grain boundary. Grain boundaries are inherent in polycrystalline materials, such as polysilicon, as it is the boundaries which define the breaks between individual crystal grains. The crystalline structure breaks down at the grain boundaries, giving rise to a high concentration of broken or "dangling" Si bonds. These dangling bonds "trap" carriers and give rise to potential barriers at the grain boundaries. These potential barriers impede the flow of carriers in polysilicon, thus reducing conductivity.

The grain boundary potential barrier height is proportional to the square of the dangling bond density, or "trap density". The smaller the grain size, the higher the trap density and thus the lower the conductance. In a TFT, the grain boundary potential barrier height is controlled by the gate voltage, and hence the conductivity is a function of the gate voltage. A larger trap concentration makes it harder for the gate to form a channel resulting in a higher threshold voltage and a lower drive current.

The grain boundary trap concentration also affects the leakage current in TFTs. In polysilicon or other polycrystalline TFTs, the presence of grain boundary traps at the drain end can dramatically increase the leakage current in the presence of a "gate-to-drain" electric field. The increase in leakage results from either "thermionic field emission" and/or "Poole-Frenkel" emission through the grain boundary traps. Accordingly, the greater the number of grain boundaries (i.e., the smaller the grain size), the greater the current leakage through the material. Greater current leakage means that more power is required to replace the leaking current to maintain an SRAM cell transistor in its desired powered-on state. Such leakage is particularly adverse in laptop computers, where desired power consumption when a cell's state is not being changed would be desired to be very low to extend battery life.

High density SRAMs (16 Mb or higher) typically require TFTs with low OFF currents (<50 fA) and high ON current (>5 nA) in order to obtain acceptable low standby leakage and high memory cell stability. Current state-of-the-art TFTs provide low standby current at the expense of ON current, or at the expense of additional process complexity. One present way of minimizing this current leakage at the cost of increased process complexity is by providing a "lightly doped offset" (LDO) region within the thin film. A lightly doped offset region is an elongated region within the thin film which is positioned effectively between the channel region and the drain region. Such a region provides a buffer zone for the electric field between the channel and drain which minimizes leakage therebetween.

It would be desirable to improve upon prior art thin film transistor constructions in a manner which further minimizes leakage current.

BRIEF DESCRIPTION OF THE DRAWINGS

Preferred embodiments of the invention are described below with reference to the following accompanying drawings.

FIG. 8 is a diagrammatic sectional view of yet another alternate wafer fragment at one processing step at an alternate method in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a thin film transistor comprises the following steps:
  providing a thin film transistor layer of polycrystalline material on a substrate, the polycrystalline material having a first average crystalline grain size;
  masking a portion of the polycrystalline thin film to define a masked portion and an unmasked portion, the masked portion comprising a thin film channel region in the polycrystalline thin film, the unmasked portion comprising a thin film drain offset region in the polycrystalline thin film, the drain offset region being operatively adjacent the channel region;
  conducting an amorphizing silicon implant into the unmasked portion of the thin film to transform such unmasked polycrystalline portion into an amorphous phase;
  annealing the substrate to convert the amorphous phase back into polycrystalline material, the converted polycrystalline material having a second average crystalline grain size which is greater than the first average crystalline grain size;
  providing a drain region in the thin film operatively adjacent the drain offset region, with the drain offset region being intermediate the channel region and the drain region; and
  providing a source region in the thin film operatively adjacent the channel region.

In accordance with another aspect of the invention, a thin film transistor comprises:
  a thin film transistor layer comprising a source region, a channel region and a drain region; the thin film transistor layer further i comprising a drain offset region positioned between the drain region and the channel region;
  the channel region being substantially polycrystalline and having a first average crystalline grain size; and
  the drain offset region being substantially polycrystalline and having a second average crystalline grain size, the second average crystalline grain size being larger than the first average crystalline grain size.

Figure 1:
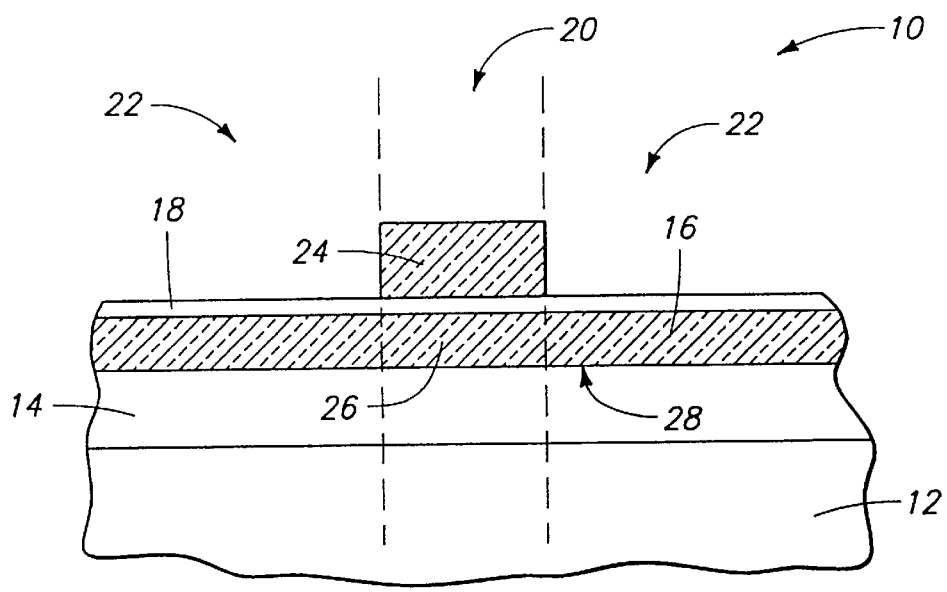
FIG. 1 is a diagrammatic cross-sectional view of a wafer fragment at one processing step in accordance with the invention.

More particularly and with reference to the figures, FIG. 1 illustrates a semiconductor wafer fragment indicated generally by reference numeral 10. Such is comprised of a bulk silicon substrate 12 and an overlying silicon dioxide layer 14. The illustration is simplified to focus on best-mode aspects of the invention, as opposed to showing possible and more typical substrate detail not particularly pertinent to the invention. A thin film transistor layer 16 of polycrystalline material, such as polysilicon or CdSe, is provided atop oxide layer 14. An example method for providing layer 16 would be to deposit an amorphous layer of silicon to a thickness between 25 and 50 nanometers, followed by solid phase crystallization at 600° C. in nitrogen for 24 hours. Such will result in a first average crystalline grain size throughout layer 16 of 0.1–0.2 microns. Layer 16 is doped with an n-type conductivity enhancing impurity at a example dose of from 1 to $5 \times 10^{12}$ atoms/cm$^2$ to provide thin film layer 16 as n– doped. Thereafter, a thin layer 18 (preferably 250 Angstroms) of gate oxide is deposited, with an example thickness being from 10 to 50 nanometers. An ONO dielectric might preferably be substituted for SiO$_2$ of layer 18.

Thin film 16 is then masked to define a masked portion 20 and an unmasked portion 22. Masking in this example is most preferably conducted by deposition of an n+ doped polysilicon layer to a thickness of 200–300 nanometers, followed by subsequent patterning of such layer to produce a TFT gate 24. Accordingly, this example principally addresses formation of a top gated thin film transistor. Masked portion 20 comprises a thin film channel region 26 in polysilicon thin film 16. Unmasked portion 22 will comprise thin film source and drain regions within film 16. Such unmasked portions 22 also comprise a thin film drain offset region 28 (to be further defined subsequently) and an adjacent channel region 26. At this point in the process, the grain structure of polysilicon layer 16 is uniform, having the first stated average crystalline grain size.

Figure 2:
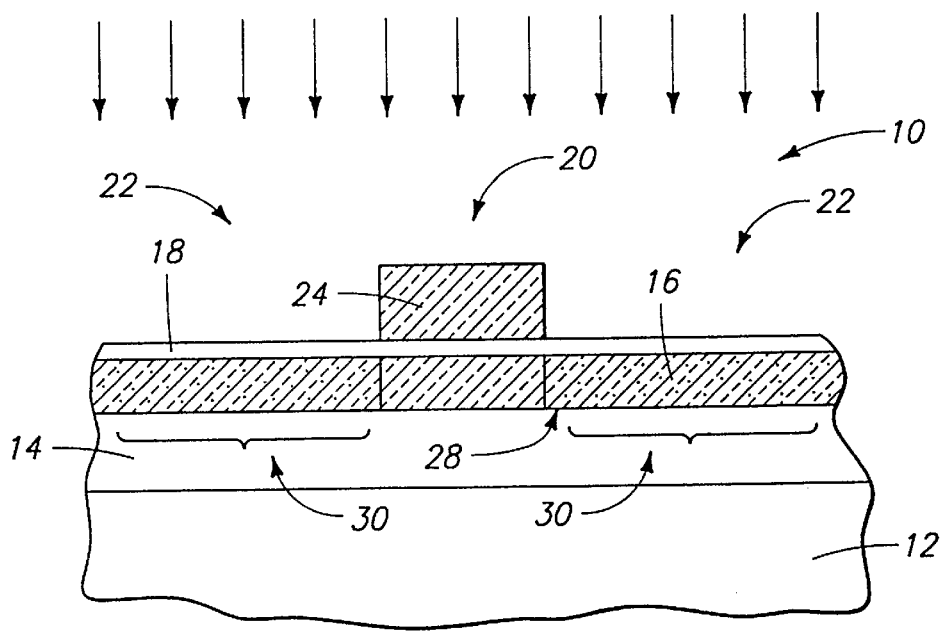
FIG. 2 is a view of the FIG. 1 wafer shown at a processing step subsequent to that shown by FIG. 1.

Referring to FIG. 2, an amorphizing silicon implant is conducted into unmasked portions 22 of thin film 16 to transform such unmasked polysilicon portion into amorphous silicon regions 30. Alternate polycrystalline materials might be utilized, with the amorphizing silicon implant rendering such material into an amorphous phase. Such can be provided by a silicon atom implant dose of from $1 \times 10^{14}$–$1 \times 10^{15}$ atoms/cm$^2$. Most preferred is a silicon atom implant of $3 \times 10^{14}$ atoms/cm$^2$.

Substrate 10 is annealed to convert the amorphous silicon (or other amorphous material) back into polysilicon, with the converted polysilicon of regions 30 having a second average crystalline grain size which is greater than the first average crystalline grain size. Such re-crystallization annealing will typically naturally occur to regions 30 of layer 16 throughout conventional semiconductor wafer processing which will ultimately subject the substrate to temperatures sufficiently high and sufficiently long to result in such recrystallization. Alternately, a purposeful-dedicated recrystallization and anneal step might be conducted at, for example, 850° C. in a nitrogen atmosphere for thirty minutes to effect the recrystallization.

Subjecting unmasked regions 22 to such an amorphizing silicon implant and recrystallization will result in larger crystals being formed in regions 30 than in channel region 26. Most preferably, the second average crystalline grain size becomes at least 50% to 200% greater than the first average crystalline grain size. An example first average crystalline grain size is approximately 0.1 microns, while an example preferred second average crystalline grain size is 0.2 microns. The FIG. 2 wafer is then preferably subjected to a p-type dopant implant to provide regions 30 with a p− doping level. Example preferred doses would include a $BF_2$ implant at $5 \times 10^{12} - 5 \times 10^{13}$ cm$^{-2}$.

Figure 3:
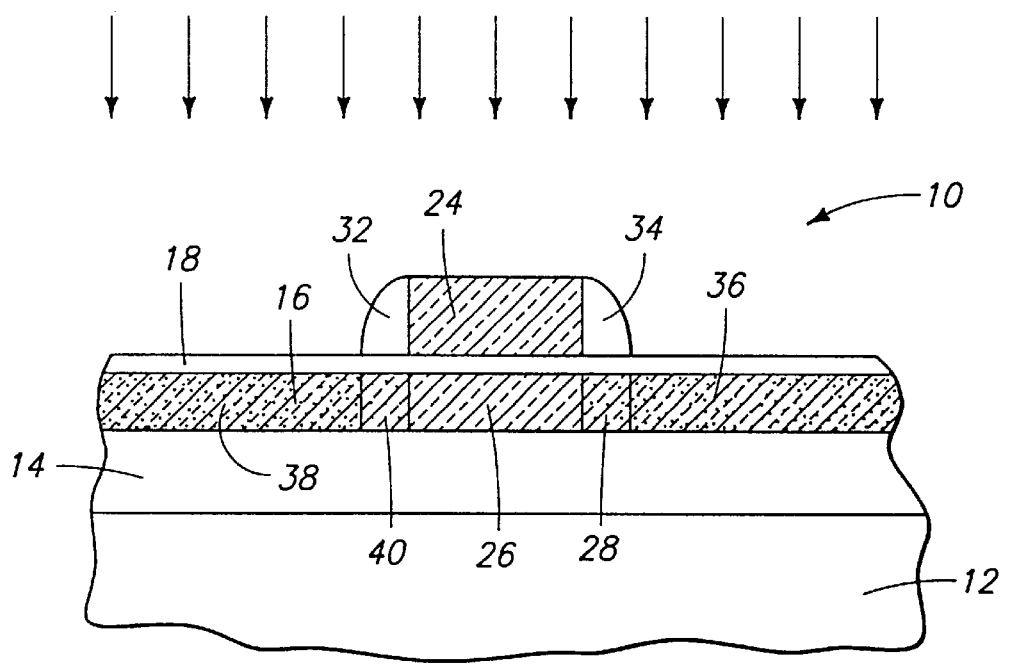
FIG. 3 is a view of the FIG. 1 wafer shown at a processing step subsequent to that shown by FIG. 2.

Referring to FIG. 3, a layer of oxide, polysilicon or some other material is deposited and subjected to an anisotropic spacer etch to produce the illustrated spacers 32 and 34. Thereafter, substrate 10 is subjected to another p-type dopant impurity implant to produce a p+ drain region 36 and a p+ source region 38. Such also completes definition of drain offset region 28 intermediate channel region 26 and drain region 36. Such further defines a source offset region 40 which is operatively adjacent to and positioned between source region 38 and channel region 26.

Thus, thin film transistor layer 16 comprises a source region 38, a channel region 26, a drain region 36 and two offset regions 28 and 40. Drain offset region 28 is operatively positioned between drain region 36 and channel region 26. Channel region 26 is substantially polycrystalline having a first average crystalline grain size. Drain offset region 28 is likewise substantially polycrystalline, having a second average crystalline grain size which is larger than the first average crystalline grain size. Although the above-described method was with respect to polysilicon, other polycrystalline materials might be utilized apart from or in combination with polycrystalline silicon, such as CdSe. Drain region 36 and source region 38 are each substantially polycrystalline having the second average crystalline grain size.

An example preferred length range for each of drain offset regions 28 and source offset regions 40 is from 0.1 micron to 0.5 micron.

Figure 4:
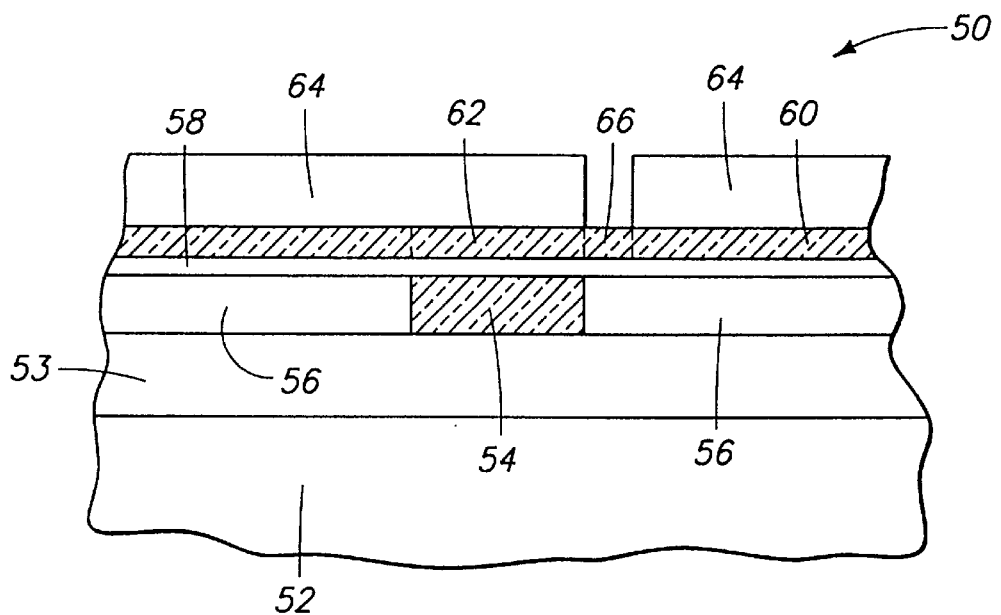
FIG. 4 is a diagrammatic sectional view of an alternate wafer fragment at one processing step in an alternate method in accordance with the invention.

The discussion proceeds with reference to FIGS. 4–7 for description of a method for producing a bottom-gated thin film transistor. FIG. 4 illustrates a simplified wafer 50 comprised of a bulk substrate 52, oxide layer 53, and overlying TFT gate 54 and opposingly adjacent insulating oxide regions 56. A gate dielectric layer 58 is provided atop regions 54 and 56, followed by a thin film transistor polysilicon layer 60 provide with an n− doping. Gate 54 thus defines a channel region 62 in thin film transistor layer 60. A layer 64 of photoresist is deposited and patterned as shown preferably to expose only a drain offset region 66 of thin film layer 60. Thus, photoresist layer 64 masks all of thin film layer 60 but for drain offset region 66. Alternately in accordance with an aspect of the invention, masking layer 64 could be patterned to protect only the channel region.

Figure 5:
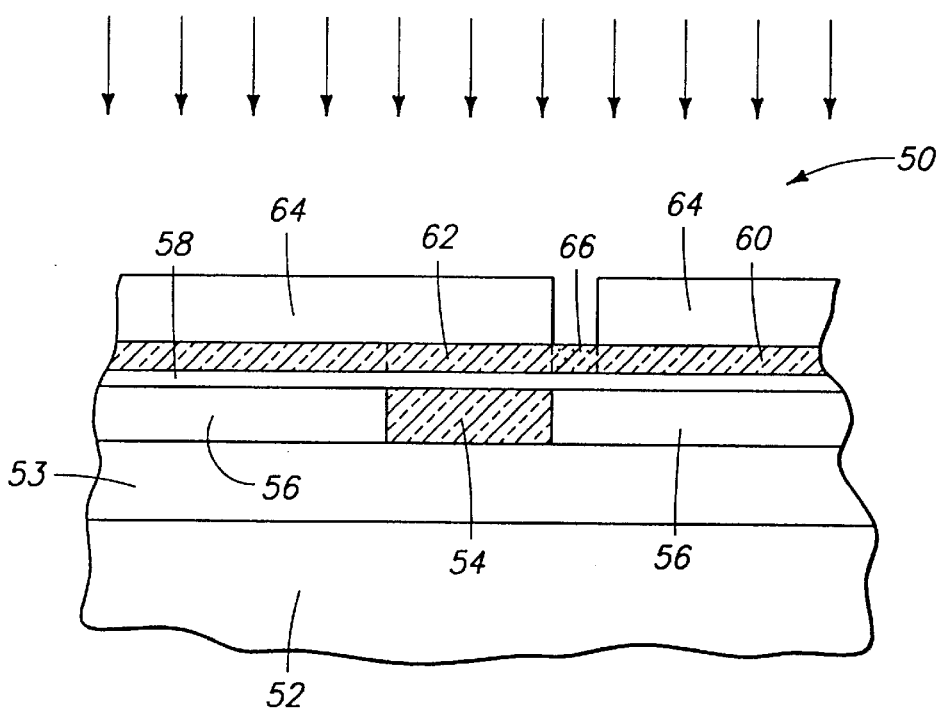
FIG. 5 is a view of the FIG. 4 wafer shown at a processing step subsequent to that shown by FIG. 4.

Referring to FIG. 5, with resist layer 64 in place, drain offset region 66 is subjected to a p− level doping such as described above, followed by an amorphizing silicon implant to render region 66 amorphous. Alternately, the amorphizing implant could precede conductivity doping. Further, Region 66 will recrystallize upon appropriate elevated temperature exposure as described above to form polycrystalline silicon having a second average crystalline grain size which is greater than the first average crystalline grain size of the remainder portion of thin film layer 60.

Figure 6:
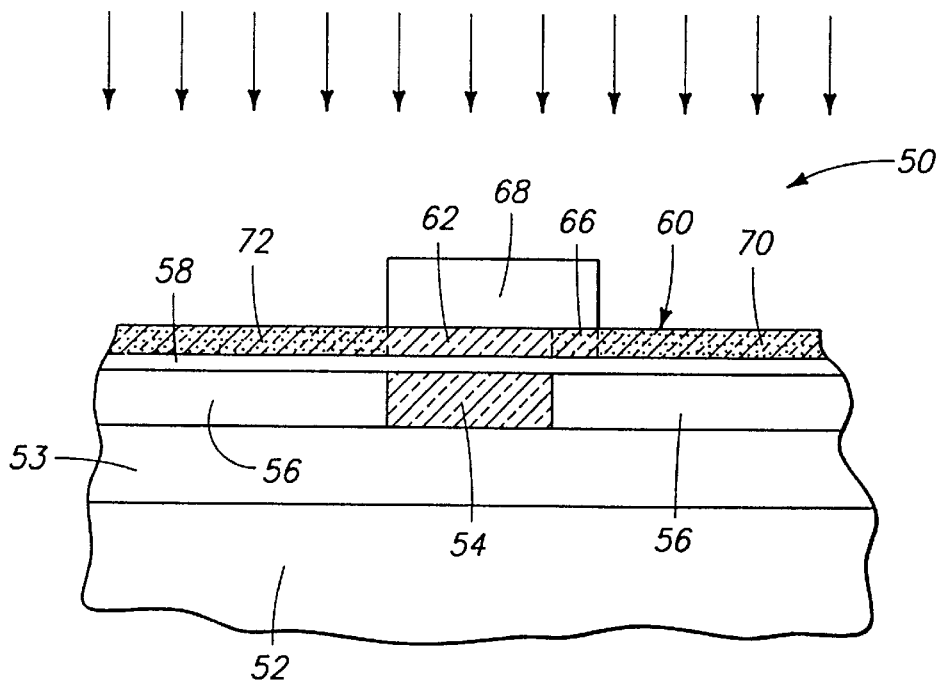
FIG. 6 is a view of the FIG. 4 wafer shown at a processing step subsequent to that shown by FIG. 5.
Figure 7:
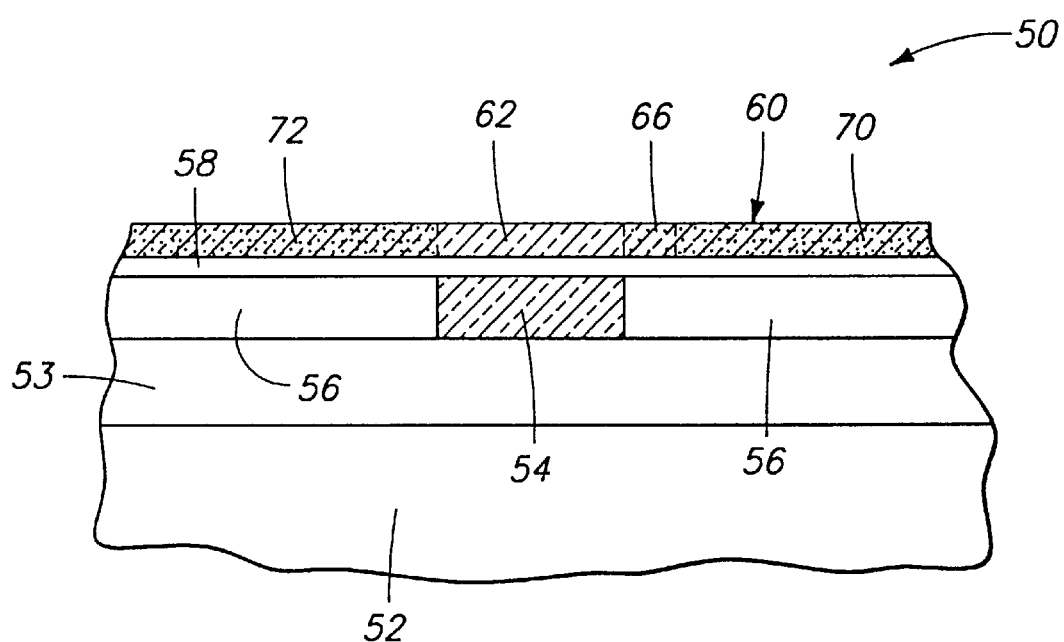
FIG. 7 is a view of the FIG. 4 wafer shown at a processing step subsequent to that shown by FIG. 6.

Referring to FIG. 6, photoresist layer 64 has been removed and a subsequent implant masking layer 68 deposited and patterned as shown. Implant layer 68 masks drain offset region 66 and channel region 62, while exposing remaining regions of thin film layer 60. With mask 68 in place, exposed portions of thin film layer 60 are subjected to a p+ implant to produce a drain region 70 and a source region 72. Thus, a thin film transistor in accordance with the invention is formed having a drain offset, but no source offset. Mask 68 may then be removed, as shown in FIG. 7. If masking material 68 comprises some other material such an insulative oxide, it might not be removed.

In all of the above-described embodiments, the resultant product produces a larger final average grain microstructure in the drain offset region as compared to the grain microstructure in the channel region. The current leakage typically trying to be prevented or minimized in SRAM or other transistors is leakage occurring from the source through the channel region to the drain. Since leakage current is dependent upon trap concentration near the drain end of a thin film transistor, the above inventive approach will reduce leakage current as it reduces average trap concentration at the drain.

The ON current is also improved since it depends upon the grain size in both the channel region and the drain offset region. Smaller grains in the channel region are desirable for improved device-to-device uniformity. When channel grain size is large, some channel regions may have 1 grain boundary while others may have 4 grain boundaries (a four fold difference). However for channel regions with small grains, the number of grain boundaries will vary from 25 to 30. The difference between 25 and 30 is only a factor of 1.2 as opposed to 4.0. Accordingly, thin film transistors with more grains in the channel tend to have less device-to-device non-uniformity.

Although the above technique for increasing crystalline grain size was by an amorphizing implant with subsequent crystallization, alternate methods might be utilized. For example, germanium implanting might be used. Further, increasing grain size in the offset region as compared to the channel region enhances overall conductivity of the offset region while minimizing current leakage. Accordingly, the drain offset region being an inherently higher conducting material than the channel region can be made longer to minimize undesired leakage current. Such should not appreciably adversely affect conductivity through the larger volume of material necessary for desired thin film transistor operation. Ideally and most preferably, thin film transistors are constructed which only have a drain offset region, and no source offset region.

FIG. 8 illustrates an alternate preferred thin film transistor embodiment in accordance with the invention which comprises a gated offset region. In this embodiment, due to the topography of the gate polysilicon and gate oxide, the drain offset region lies next to the gate sidewall. Specifically, FIG. 8 illustrates a wafer fragment 75 comprised of a bulk substrate 76 and overlying $SiO_2$ layer 78. A thin film transistor polysilicon gate 80 is provided atop layer 78. A subsequent gate oxide dielectric layer 82 (preferably ONO) is deposited atop polysilicon gate 80. A thin film transistor layer 84 is thereafter deposited. Such comprises a source region 86, a channel region 88, a drain offset region 90, and a drain region 92.

As with the above-described constructions, the average crystalline grain size of drain offset region 90 is provided to be greater than the average crystalline grain size of channel region 88. The described construction overlaps offset region 90 with gate 80. This effectively provides two transistors in series, where one is the main channel-transistor and the other is the an offset transistor. Overall transistor performance is improved by the effective gating of the offset region.

Considering the above construction, the Poole-Frenkel and Thermionic Field Emission based leakage model was applied in evaluating the following process variations: gate oxide thickness, channel polysilicon thickness, offset doping concentration, and source/drain misalignment. The nominal device parameters were 0.3 micron offset (FIG. 8, dimension 95); 250 Angstrom thick oxide dielectric layer 82; a 500 Angstrom thick channel polysilicon region 88, $5.3\times10^{12}$ cm$^2$ (p) channel dose; and $5\times10^{12}$ cm$^2$ (BF$_2$) offset dose. It was found that when the gate oxide or channel polysilicon thickness is varied by plus or minus 20%, the leakage current variation is less than 3%. When there is a negative source/drain misalignment such that the drain/channel junction becomes closer to the sidewall oxide, the leakage current increases dramatically. If the offset dose was decreased from 5 to $3\times10^{12}$ atoms/cm$^2$, such that the net n-type doping concentration is higher, the leakage current increased by more than a factor of 10.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a thin film transistor comprising the following steps:
   forming a thin film transistor layer of polycrystalline material on a substrate;
   masking a portion of the polycrystalline thin film to define a masked portion and an unmasked portion; the masked portion comprising a thin film channel region, source region and drain region in the polycrystalline thin film; the unmasked portion comprising a drain offset region in the polycrystalline thin film; and
   conducting a germanium implant into the unmasked portion of the thin film.

2. A method of forming a thin film transistor comprising the following steps:
   forming a thin film transistor layer of polycrystalline material on a substrate;
   masking a portion of the polycrystalline thin film to define a masked portion and an unmasked portion, the masked portion comprising a thin film channel region in the polycrystalline thin film;
   conducting a germanium implant into the unmasked portion of the thin film; and
   the thin film transistor being formed to be bottom gated.

3. A method of forming a thin film transistor, comprising:
   forming an insulative material layer over a semiconductive substrate;
   forming a thin film transistor layer of polycrystalline material over the insulative material layer;
   defining a thin film drain offset region in the polycrystalline thin film, and defining a drain region in the polycrystalline thin film;
   masking the drain region while leaving the drain offset region unmasked; and
   conducting a germanium implant into the unmasked portion of the thin film to transform such unmasked polycrystalline portion into an amorphous phase.

4. The method of claim 1 wherein the formed thin film transistor is a bottom-gated transistor.

5. A method of forming a thin film transistor comprising the following steps:
   forming a thin film transistor layer of polycrystalline material on a silicon dioxide layer, the polycrystalline material having a first average crystalline grain size;
   masking a portion of the polycrystalline thin film to define a masked portion and an unmasked portion, the masked portion comprising a thin film channel region in the polycrystalline thin film, the unmasked portion comprising a thin film drain offset region in the polycrystalline thin film, the drain offset region being operatively adjacent the channel region;
   conducting a germanium implant into the unmasked portion of the thin film to transform such unmasked polycrystalline portion into an amorphous phase;
   annealing the thin film layer to convert the amorphous phase back into polycrystalline material, the converted polycrystalline material having a second average crystalline grain size which is greater than the first average crystalline grain size;
   forming a drain region in the thin film operatively adjacent the drain offset region, with the drain offset region being intermediate the channel region and the drain region;
   forming a source region in the thin film operatively adjacent the channel region;
   the thin film transistor being formed to be bottom gated, and wherein the step of masking masks all of the thin film but for the drain offset region of the thin film; and
   the steps of forming source and drain regions comprise masking the channel region and the drain offset region while doping exposed portions of the thin film with a conductivity enhancing impurity.

* * * * *

UNITED STATES PATENT AND TRADEMARK OFFICE
CERTIFICATE OF CORRECTION

PATENT NO.    : 6,214,652 B1
DATED         : April 10, 2001
INVENTOR(S)   : Shubneesh Batra et al.

Page 1 of 1

It is certified that error appears in the above-identified patent and that said Letters Patent is hereby corrected as shown below:

Column 1,
Line 4, add the following:

-- GOVERNMENT RIGHTS

This invention was made with the United States Government support under contract No.: MDA972-92-C-0054 awarded by the Advanced Research Projects Agency (ARPA). The United States Government has certain rights in this invention. --

Line 24, delete "le".
Line 29, replace "(TF1)." with -- (TFT). --.
Line 63, replace "cell-can" with -- cell can --.

Column 4,
Line 11, delete "i".

Column 8,
Line 21, replace "1" with -- 3 --.

Signed and Sealed this

Twenty-fifth Day of December, 2001

Attest:

*Attesting Officer*

JAMES E. ROGAN
*Director of the United States Patent and Trademark Office*